(12) United States Patent
Chun et al.

(10) Patent No.: US 10,910,584 B2
(45) Date of Patent: Feb. 2, 2021

(54) LIGHT EMITTING DEVICE HAVING INSULATION LAYER OF VARYING THICKNESS AND MANUFACTURING METHOD THEREOF

(71) Applicant: SAMSUNG DISPLAY CO., LTD., Yongin-si (KR)

(72) Inventors: Jun Chun, Hwaseong-si (KR); Jin-Su Byun, Seoul (KR); Bo Geon Jeon, Hwaseong-si (KR); Jun Gi Kim, Hwaseong-si (KR); Jeong Min Park, Seoul (KR); Yang-Ho Jung, Seoul (KR); Seon Hwa Choi, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 15/976,423

(22) Filed: May 10, 2018

(65) Prior Publication Data

US 2019/0115559 A1    Apr. 18, 2019

(30) Foreign Application Priority Data

Oct. 18, 2017    (KR) .................. 10-2017-0135322

(51) Int. Cl.
*H01L 51/00* (2006.01)
*H01L 51/52* (2006.01)
*H01L 33/36* (2010.01)
*H01L 27/32* (2006.01)

(52) U.S. Cl.
CPC ...... *H01L 51/5206* (2013.01); *H01L 27/3258* (2013.01); *H01L 27/3262* (2013.01); *H01L 33/36* (2013.01); *H01L 51/5209* (2013.01); *H01L 2251/558* (2013.01)

(58) Field of Classification Search
CPC ........... H01L 2251/558; H01L 27/3258; H01L 27/3262; H01L 33/36; H01L 51/5206; H01L 51/5209
See application file for complete search history.

(56) References Cited

U.S. PATENT DOCUMENTS

2013/0105781 A1*    5/2013   Matsushima ....... H01L 27/3258
                                                                257/40

FOREIGN PATENT DOCUMENTS

| EP | 3 144 971 | 3/2017 |
|---|---|---|
| EP | 3 174 120 | 5/2017 |
| JP | 5588007 | 9/2014 |
| KR | 10-0611652 | 8/2006 |
| KR | 10-0637130 | 10/2006 |

* cited by examiner

*Primary Examiner* — Robert G Bachner
(74) *Attorney, Agent, or Firm* — F. Chau & Associates, LLC

(57) ABSTRACT

A light emitting device includes a substrate. A thin film transistor is disposed on the substrate. A first electrode is connected to the thin film transistor. A second electrode at least partially overlaps the first electrode. A first partition wall is disposed between the first electrode and the second electrode. An insulating layer is disposed between the thin film transistor and the first electrode. The insulating layer includes a first part having a first thickness and a second part having a second thickness that is different than the first thickness. The second part of the insulating layer at least partially overlaps the first partition wall.

11 Claims, 11 Drawing Sheets

LIGHT EMITTING DEVICE HAVING INSULATION LAYER OF VARYING THICKNESS AND MANUFACTURING METHOD THEREOF

CROSS-REFERENCE TO RELATED APPLICATION

This application claims priority to and the benefit of Korean Patent Application No. 10-2017-0135322 filed in the Korean Intellectual Property Office on Oct. 18, 2017, the entire contents of which are incorporated by reference herein.

TECHNICAL FIELD

The present disclosure relates to a light emitting device, and more specifically, to a light emitting device including an insulating layer having different thicknesses, and a manufacturing method thereof.

DISCUSSION OF THE RELATED ART

A light emitting element may be an element in which holes supplied from an anode and electrons supplied from a cathode are combined within an organic emission layer to form excitons. Light is emitted as the excitons relax.

Such a light emitting element may have a wide viewing angle, a fast response, lower power consumption, and may be relatively thin as compared to other types of light emitting elements. Accordingly, such a light emitting element is widely applied to various electrical and electronic devices such as a television, a monitor, a mobile phone, etc.

The light emitting device including the light emitting element further includes a thin film transistor (or similar structure) connected to the light emitting element and an insulating layer.

SUMMARY

A light emitting device includes a substrate. A thin film transistor is disposed on the substrate. A first electrode is connected to the thin film transistor. A second electrode at least partially overlaps the first electrode. A first partition wall is disposed between the first electrode and the second electrode. An insulating layer is disposed between the thin film transistor and the first electrode. The insulating layer includes a first part having a first thickness and a second part having a second thickness that is different than the first thickness. The second part of the insulating layer at least partially overlaps the first partition wall.

A method for manufacturing a light emitting device includes forming a thin film transistor on a substrate. An insulating layer is formed on the substrate. A half-tone mask is disposed on the insulating layer. The insulating layer is etched using the half-tone mask to form a first part of the insulating layer that has a first thickness, a second part of the insulating layer that has a second thickness different from the first thickness, and an opening overlapping the thin film transistor.

A light emitting device includes a substrate. An insulating layer is disposed on the substrate. A first electrode is disposed on the insulating layer. A partition wall is disposed on the first electrode. An emission layer is disposed on the first electrode next to the partition wall. A second electrode is disposed on the partition wall and the emission layer. The partition wall is thinner in an area closer to the emission layer than in an area farther from the partition wall.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

Figure 1:
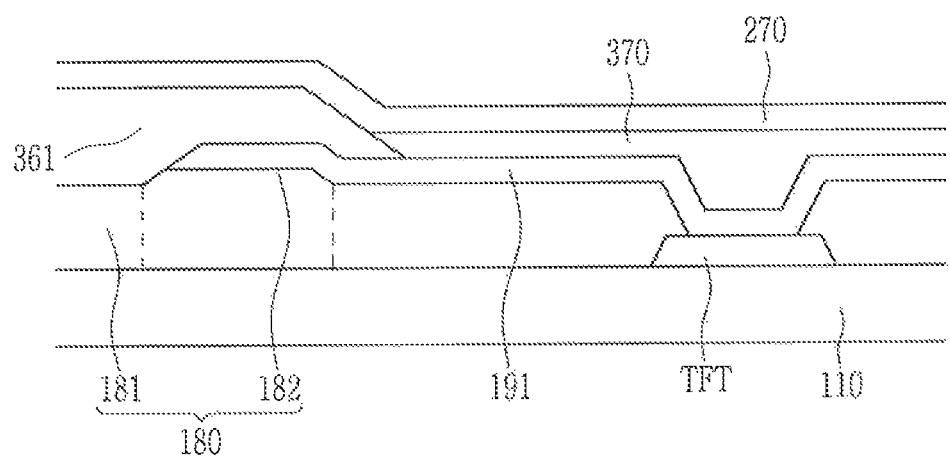
FIG. 1 is a cross-sectional view illustrating a structure of a light emitting device according to an exemplary embodiment of the present invention.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Like reference numerals may designate like elements throughout the specification and the drawings. To the extent that detailed description of various elements have been omitted herein, it may be assumed that these elements are at least similar to corresponding elements described in detail elsewhere within the disclosure.

In the drawings, size and thickness of each element such as layers, films, panels, regions, etc., may be exaggerated for clarity.

It will be understood that when an element such as a layer, film, region, or substrate is referred to as being "on" another element, it can be directly on the other element or intervening elements may also be present. In Further, in the specification, the word "on" or "above" may mean disposed on or below the object portion, and does not necessarily mean disposed on the upper side of the object portion based on a gravitational direction.

Further, in this specification, the phrase "on a plane" may mean viewing a target portion from the top, and the phrase "on a cross-section" may mean viewing a cross-section formed by vertically cutting a target portion from the side.

Now, a light emitting device according to an exemplary embodiment of the present invention will be described with reference to FIG. 1. FIG. 1 is a cross-sectional view illustrating a structure of a light emitting device according to an exemplary embodiment of the present invention.

Referring to FIG. 1, the light emitting device, according to an exemplary embodiment of the present invention, includes a substrate 110. A thin film transistor TFT is disposed on the substrate 110. A first electrode 191 is connected to the thin film transistor ITT. A second electrode 270 overlaps the first electrode 191. A partition wall 361 and an emission layer 370 are each disposed between the first electrode 191 and the second electrode 270. An insulating layer 180 is disposed between the thin film transistor TFT and the first electrode 191. The insulating layer 180 includes a first part 181 having a first thickness and a second part 182 having a second thickness. The second part 182 of the insulating layer 180 overlaps the partition wall 361.

As shown in FIG. 1, the thickness of the second part 182 is larger than the thickness of the first part 181. For example, the second part 182 of the insulating layer 180 protrudes to a greater extent than the first part 181, and accordingly the thickness of the partition wall 361 overlapping the second part 182 of the insulating layer 180 becomes thinner than the thickness of the partition wall 361 overlapping the first part 181 of the insulating layer. The second part 182 is disposed adjacent to a boundary of the partition wall 361 and the emission layer 370. However, the second part 182 does not overlap the emission layer 370.

As described above, the second part 182 of the insulating layer that is disposed adjacent to the emission layer 370 and does not overlap the emission layer 370 may prevent damage to the emission layer 370 that may otherwise be caused by an output gas released from the insulating layer 180 (e.g. outgassing).

An organic material is used as the insulating layer 180, and in the case of the organic layer, an output gas may be generated during manufacturing and/or use. The output gas may be a material including fluorine or hydrogen, etc., that was initially included in the organic material, but is subsequently released. When the output gas reaches the emission layer or the electrode, oxidation may be induced, thereby reducing a pixel area. For example, the edge of the emission layer 370 is oxidized by the output gas such that the emission area is substantially reduced.

However, in the light emitting device, according to an exemplary embodiment of the present invention, the thickness of the insulating layer 180 adjacent to the emission layer 370 is large, as compared to other portions of the insulating layer 180, such that an amount of the output gas that reaches the emission layer 370 is reduced, thereby preventing the reduction of the pixel area.

Figure 2:
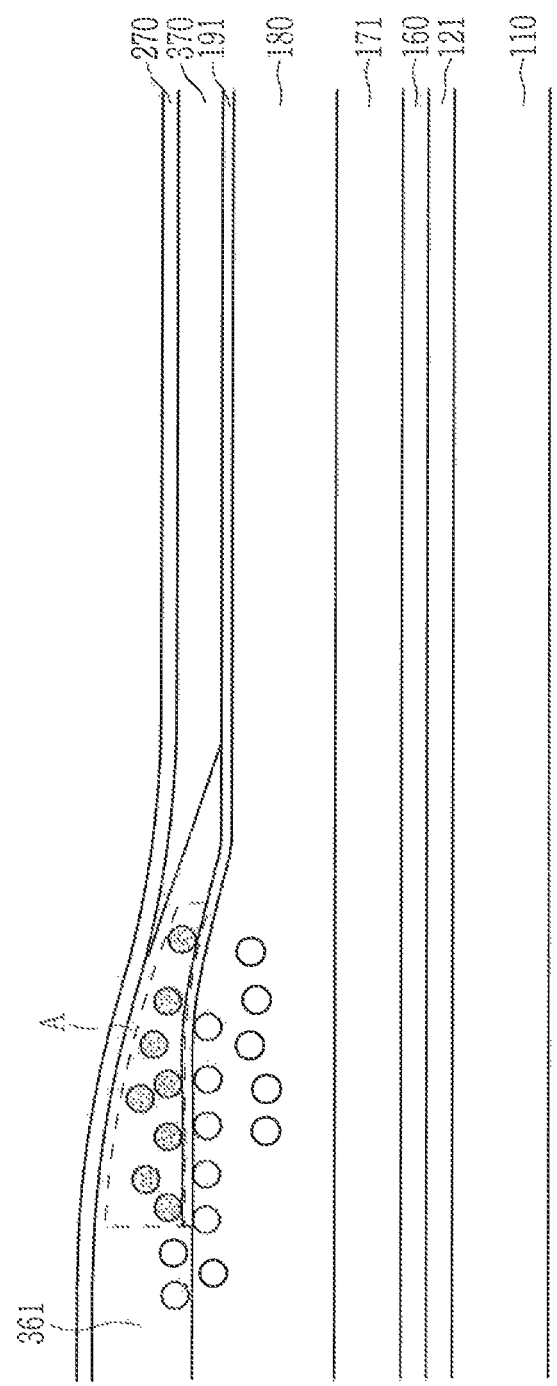
FIG. 2 is a view illustrating movement of an output gas in a light emitting device according to an exemplary embodiment of the present invention.
Figure 3:
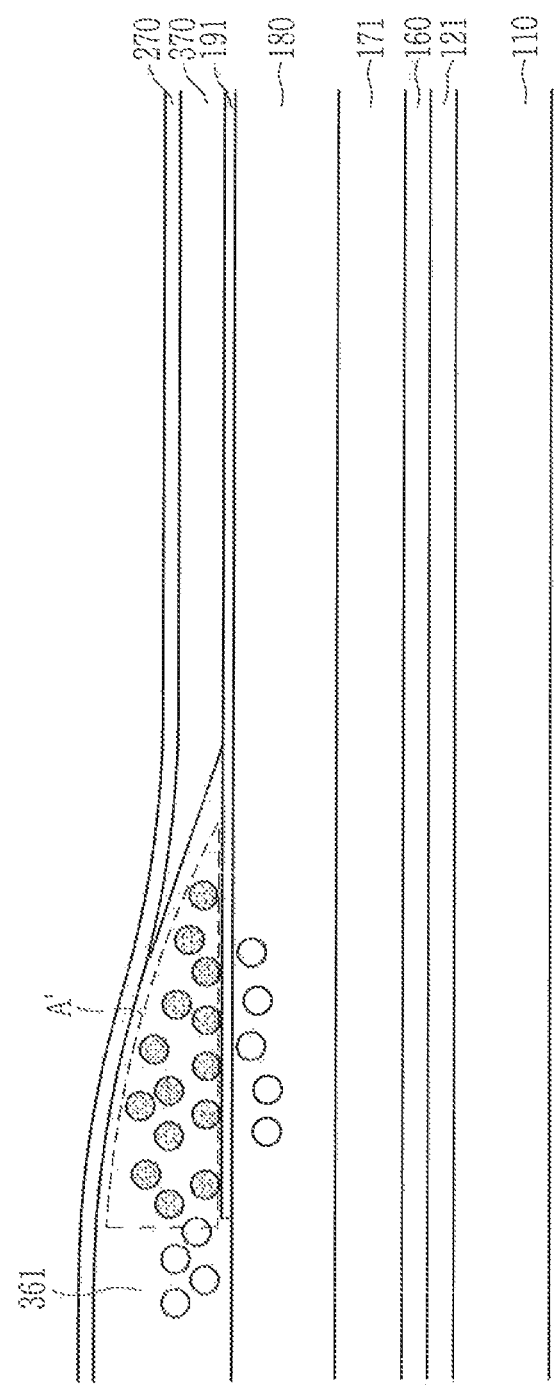
FIG. 3 is a view illustrating movement of an output gas in a light emitting device according to a comparative example of the present invention.

FIG. 2 is a view illustrating movement of an output gas in a light emitting device according to an exemplary embodiment of the present invention. FIG. 3 is a view illustrating movement of an output gas in a light emitting device according to a comparative example of the present invention.

Referring to FIG. 2 and FIG. 3, the output gas may be generated from both the insulating layer 180 and the partition wall 361. However, the gas generated below the first electrode 191 is blocked by the first electrode 191, thereby preventing the flow of gas inside the emission layer 370. While the output gas is also generated from the partition wall 361, the gas that is generated farther from the emission layer 370 does not tend to reach the emission layer 370. The unfilled (white) circles illustrated in FIG. 2 indicate the output gas that does not tend to reach the emission layer 370. The shaded circles illustrated in FIG. 2 represent the output gas that is likely to flow to the emission layer 370, where it could cause damage to the emission layer 370, for example, by contributing to oxidation. This region is indicated by area "A" found within the broken lines. For example, referring to FIG. 2, the output gas generated from the partition wall 361, between the first electrode 191 and the second electrode 270, adversely affects the emission layer 370.

Referring to FIG. 1 and FIG. 2, according to exemplary embodiments of the present invention, the insulating layer 180 includes the second part 182 having the second thickness in the region adjacent to the emission layer 370, thereby reducing the thickness of the partition wall 361 in the portion of the partition wall 361 closest to the emission layer 370. Accordingly, the amount of the output gas generated from the corresponding region is reduced, and the damage to the emission layer 370 due to the output gas may be prevented compared with a case that the insulating layer 180 has a uniform thickness.

FIG. 3 illustrates a light emitting device according to a comparative example of the present invention. Referring to FIG. 3, in the light emitting device, according to the comparative example, the insulating layer 180 has the same thickness throughout, which is to say, the thickness of the insulating layer 180 is uniform. Accordingly, the partition wall between the first electrode 191 and the second electrode 270 is thicker compared with the exemplary embodiment of FIG. 2. The part indicated by "A" in FIG. 2 and the part indicated by "A'" in FIG. 3 respectively represent a region where the output gas affecting the emission layer 370 is generated. Referring to FIG. 2, according to an exemplary embodiment of the present invention, and FIG. 3, according to the comparative example, since the area "A" of FIG. 2 is narrower than the area "A'" of FIG. 3, it may be confirmed that the damage to the emission layer 370 due to the generation of the output gas may be minimized in the light emitting device according to the present exemplary embodiment.

FIG. 2 and FIG. 3 show a configuration in which each of the substrate 110, a gate line 121, an interlayer insulating layer 160, a data line 171, etc. are disposed under the insulating layer 180. However, the configuration of various elements such as that of the gate line 121 and the data line 171 has been simplified, and the detailed explanation will be described later.

Referring to FIG. 1, the first electrode 191 overlaps both the first part 181 and the second part 182 of the insulating layer 180, and blocks the output gas generated under the second part 182 from reaching the emission layer 370. However, the insulating layer 180 of the region overlapping the emission layer 370 only includes the first part 181 having the first thickness and is flat, and accordingly the first electrode 191 of the region overlapping the emission layer 370 is also flat.

According to an exemplary embodiment of the present disclosure, the thickness of the partition wall 361 overlapping the second part 182 of the insulating layer 180 may be within the range of 1.0 µm to 1.2 µm. Additionally, the thickness of the partition wall 361 overlapping the first part 181 of the insulating layer 180 may be within the range of 1.4 µm to 2.0 µm.

For example, the portion of the partition wall 361 overlapping the second part 182 of the insulating layer is thinner than the portion of the partition wall 361 overlapping the first part 181, and accordingly the damage to the emission layer 370 due to the output gas may be prevented.

According to exemplary embodiments of the present invention, a difference in the thickness of the first part 181 of the insulating layer 180 and the second part 182 of the insulating layer 180 may be within the range of 20% to 40%. Also, the difference in the thickness of the partition wall 361 overlapping the first part 181 of the insulating layer 180 and the thickness of the partition wall 361 overlapping the second part 182 of the insulating layer 180 may be within the range of 20% to 40%.

Referring to FIG. 1 and FIG. 2, the first part 181 of the insulating layer 180 and the second part of the insulating layer 180 are connected with an inclined surface. In this case, an angle of the inclined surface may be 15 degrees to 25 degrees, with respect to a plane of the substrate 110. Also, the partition wall 361 has the inclined surface on the part in contact with the emission layer 370, and the angle of the inclined surface may be within the range of 15 degrees to 25 degrees, with respect to a plane of the substrate 110. For example, the angle of the inclined surface between the first part 181 and the second part 182 of the insulating layer 180 may be similar to the angle of the inclined surface of the partition wall 361.

As described above, in the light emitting device, according to an exemplary embodiment of the present invention, the insulating layer 180 includes the first part 181 having the first thickness and the second part 182 having the second thickness and the thickness of the partition wall 361 overlapping the second part 182 decreases, thereby minimizing the damage to the emission layer 370 due to the generation of the output gas.

Next, the detailed structure of the light emitting device according to an exemplary embodiment of the present invention will be described in detail with reference to accompanying drawings.

The display device, according to an exemplary embodiment of the present invention, will be described with reference to accompanying drawings.

Figure 4:
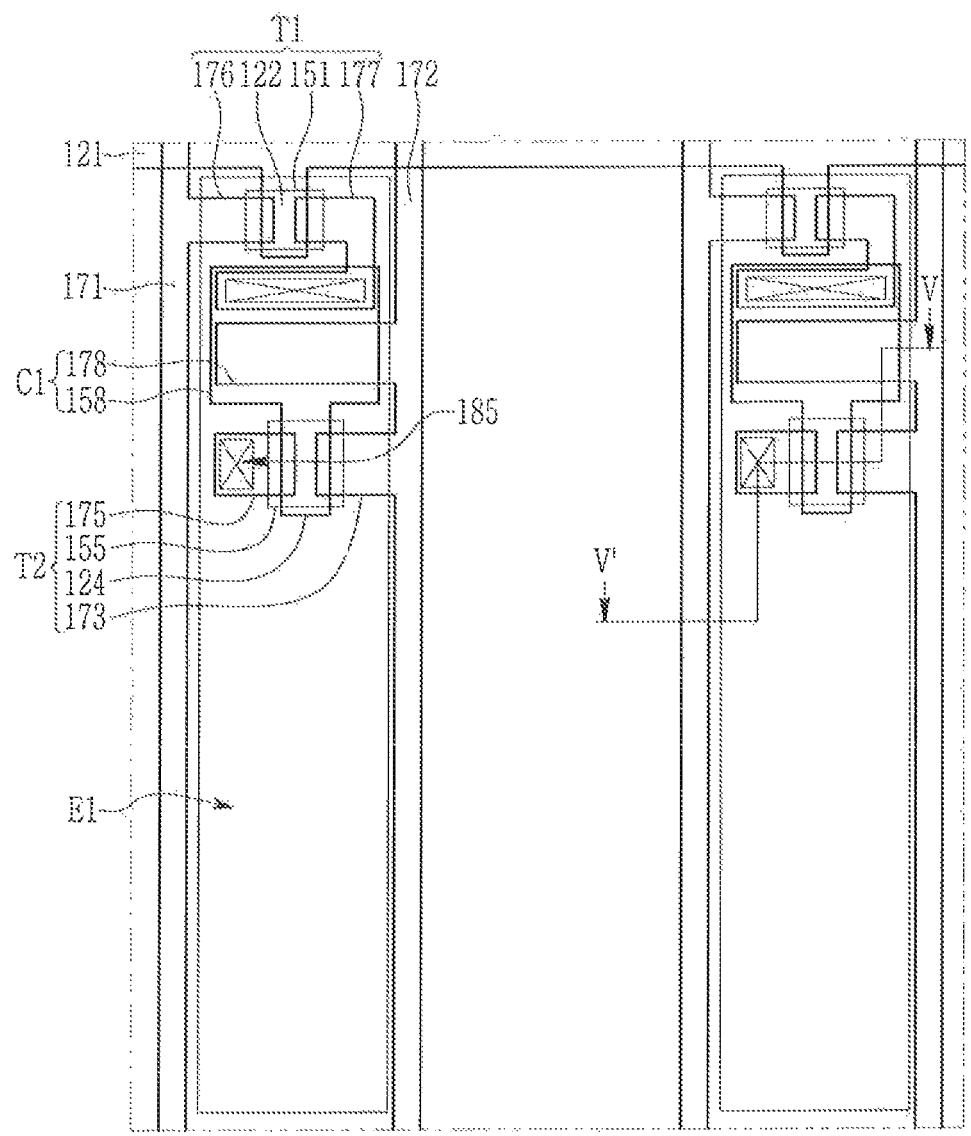
FIG. 4 is a top plan view illustrating a display device according to an exemplary embodiment of the present invention.
Figure 5:
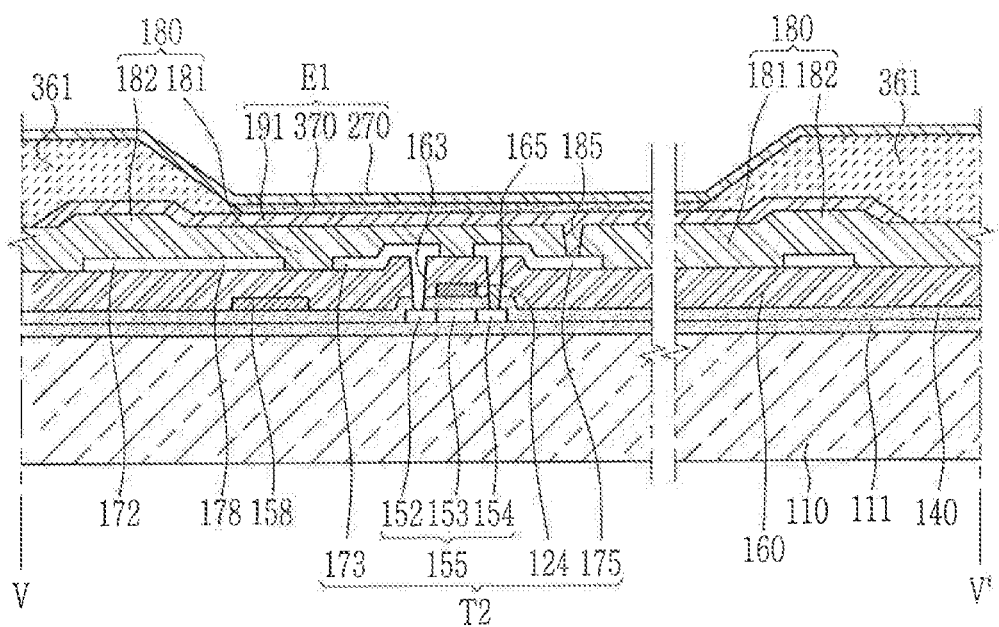
FIG. 5 is a cross-sectional view taken along line V-V' of FIG. 4.

FIG. 4 is a top plan view illustrating a display device according to an exemplary embodiment of the present invention. FIG. 5 is a cross-sectional view taken along line V-V' of FIG. 4.

In these drawings, an active matrix (AM) light emitting display device of a 2Tr-1Cap structure in which each pixel of the display area includes two thin film transistors (TFT) T1 and T2 and one capacitive element C1 is shown, however the present invention is not limited to this type of light emitting display devices, and the present invention may accordingly be applied to different types of display devices.

Accordingly, the light emitting device may provide three or more transistors and two or more capacitive elements in one pixel, and separate wiring may be further formed such that various structures may be achieved. Here, the pixel is a minimum unit of displaying an image, and the display area displays the image through the plurality of pixels.

Referring to FIG. 4 and FIG. 5, the light emitting device, according to exemplary embodiments of the present invention, includes a switching thin film transistor T1, a driving thin film transistor T2, a capacitive element C1, and a light emitting element E1 which are respectively formed in each of a plurality of pixels disposed on the substrate 110. On the substrate 110, a gate line 121 disposed along one direction and a data line 171 and a common power line 172 that are insulated from and cross the gate line 121 are disposed. Here, each pixel may be defined by boundaries where the gate line 121, the data line 171, and the common power line 172, intersect, but the pixels may be alternately defined.

The organic light emitting element E1 includes a first electrode 191, an emission layer 370 formed on the first electrode 191, and a second electrode 270 formed on the emission layer 370.

Here, the first electrode 191 becomes an anode that is a hole injection electrode and the second electrode 270 becomes a cathode that is an electron injection electrode. However, the present invention is not limited thereto, and the first electrode 191 may become the cathode and the second electrode 270 may become the anode depending on a driving method of the light emitting device. The first electrode 191 may be a pixel electrode, and the second electrode 270 may be a common electrode.

The emission layer 370 may include an organic emission layer, and the injected holes and the injected electrons are combined with each other within the emission layer 370 so as to form excitons, and when the excitons relax from an excited state to a ground state, light is emitted. Also, the emission layer 370 may include quantum dots for changing the color (frequency) of light that is emitted.

The capacitive element C1 includes a pair of capacitive plates 158 and 178 disposed via an interlayer insulating layer 160 interposed therebetween. Here, the interlayer insulating layer 160 becomes a dielectric material. A capacitance is determined by charge to the capacitive element C1 and a voltage between the pair of capacitive plates 158 and 178.

The switching thin film transistor T1 includes a switching semiconductor layer 151, a switching gate electrode 122, a switching source electrode 176, and a switching drain electrode 177. The driving thin film transistor T2 includes a driving semiconductor layer 155, a driving gate electrode 124, a driving source electrode 173, and a driving drain electrode 175.

The switching thin film transistor T1 is used as a switching element for selecting the pixel to emit light. The switching gate electrode 122 is connected to the gate line 121, and the switching source electrode 176 is connected to the data line 171. The switching drain electrode 177 is spaced apart from the switching source electrode 176 and the switching drain electrode 177 is connected to one capacitive plate 158.

The driving thin film transistor T2 applies driving power for emitting the emission layer 370 of the organic light emitting element E1 within the switched pixel to the first electrode 191. The first gate electrode 124 is connected to the capacitive plate 158 connected to the switching drain electrode 177. The driving source electrode 173 and the other capacitive plate 178 are connected to the common power line 172, respectively.

The driving drain electrode 175 is connected to the first electrode 191 through a contact hole 185.

An organic light emitting device according to an exemplary embodiment of the present invention will be described in detail with reference to FIG. 4 along with FIG. 5.

A buffer layer 111 is disposed on a substrate 110. The substrate 110 may include glass, quartz, ceramic, plastic, etc. The buffer layer 111 may include a silicon nitride ($SiN_x$), a silicon oxide ($SiO_x$), a silicon oxynitride ($SiO_xN_y$), etc., however the buffer layer 111 may alternatively include other materials. Herein, x and y may each represent an integer value in the range of 1 to 5.

The driving semiconductor layer 155 is formed on the buffer layer 111. The driving semiconductor layer 155 may be made of various semiconductor materials such as a polycrystalline silicon layer and an amorphous silicon layer. The driving semiconductor layer 155 includes a source region 152, a channel region 153, and a drain region 154.

A gate insulating layer 140 may include a silicon nitride or a silicon oxide and may be disposed on the driving semiconductor layer 155. The driving gate electrode 124 and the first capacitive plate 158 are disposed on the gate insulating layer 140. In this case, the driving gate electrode 124 overlaps at least part of the driving semiconductor layer 155, such as, the channel region 153.

The interlayer insulating layer 160 covering the driving gate electrode 124 is disposed on the gate insulating layer 140. The interlayer insulating layer 160 may be formed of a silicon nitride or a silicon oxide like the gate insulating layer 140. The gate insulating layer 140 and the interlayer insulating layer 160 may each have a first contact hole 163 and a second contact hole 165 exposing the source region 152 and the drain region 154 of the driving semiconductor layer 155.

The driving source electrode 173, the driving drain electrode 175, the data line 171, the common power line 172, and the second capacitive plate 178 are disposed on the interlayer insulating layer 160. The driving source electrode 173 and the driving drain electrode 175 are connected to the source region 152 and the drain region 154 of the driving semiconductor layer 155 through the first contact hole 163 and the second contact hole 165.

The insulating layer 180 covering the driving source electrode 173 and the driving drain electrode 175 is disposed on the interlayer insulating layer 160. The insulating layer 180 may include the organic material such as a polyacrylic series, a polyimide series, etc.

The insulating layer 180 includes the first part 181 having the first thickness and the second part 182 having the second thickness. The thickness of the second part 182 is larger than the thickness of the first part 181. In this case, the thickness difference of the first part 181 and the second part 182 may be within the range of 20% to 40%. The first part 181 and the second part 182 may be connected with the inclined surface, and the angle of the inclined surface may be within the range of 20 degrees to 40 degrees, with respect to the plane of the substrate 110.

The insulating layer 180 has the contact hole 185. The first electrode 191 is disposed on the insulating layer 180. The first electrode 191 may be the pixel electrode. The first electrode 191 is connected to the driving drain electrode 175 through the contact hole 185. The partition wall 361 is disposed on the insulating layer 180. For example, the partition wall 361 may overlap the second part 182 of the insulating layer 180. In this case, the thickness of the partition wall 361 overlapping the second part 182 of the insulating layer 180 may be within the range of 1.0 μm to 1.2 μm. Also, the thickness of the partition wall 361 overlapping the first part 181 of the insulating layer 180 may be within the range of 1.4 μm to 2.0 μm.

The emission layer 370 overlaps the first electrode 191, and the second electrode 270 overlaps the emission layer 370. The second electrode 270 may be the common electrode. The light emitting element E1 includes the first electrode 191, the emission layer 370, and the second electrode 270.

Figure 6:
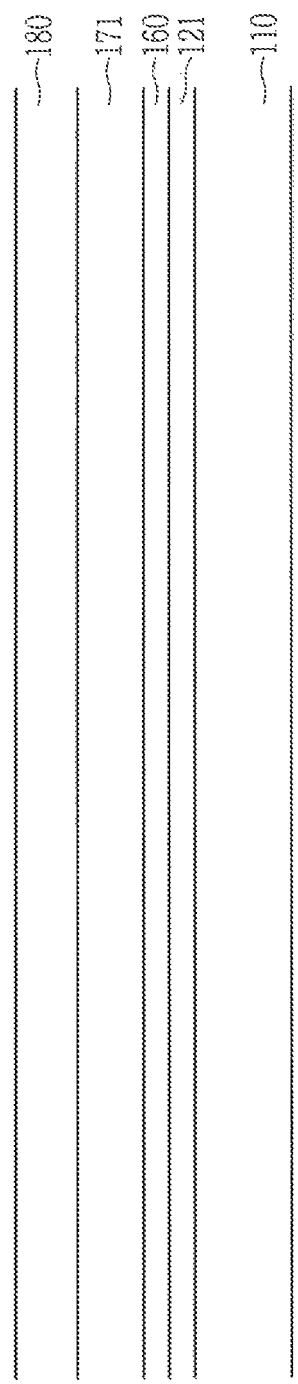
FIG. 6 to FIG. 11 are process flowcharts illustrating a method of manufacturing a light emitting device according to an exemplary embodiment of the present invention.

Next, a method of manufacturing the light emitting device according to an exemplary embodiment of the present invention will be described. FIG. 6 to FIG. 11 are process flowcharts illustrating a method of manufacturing a light emitting device according to an exemplary embodiment of the present invention. Referring to FIG. 6, the insulating layer 180 is formed on the substrate including the thin film transistor.

In this case, the substrate including the thin film transistor may include the gate line 121, the interlayer insulating layer 160, and the data line 171 disposed on the substrate 110. The detailed structure may be substantially the same as shown in FIG. 5, and to the extent that description of some elements is omitted, it may be assumed that the description is at least similar to prior descriptions of corresponding elements. For example, in the cross-sectional view to be described later, the structure of the thin film transistor, etc. is simplified, however the detailed structure is not limited to the structure illustrated in FIG. 6 to FIG. 11.

Figure 7:
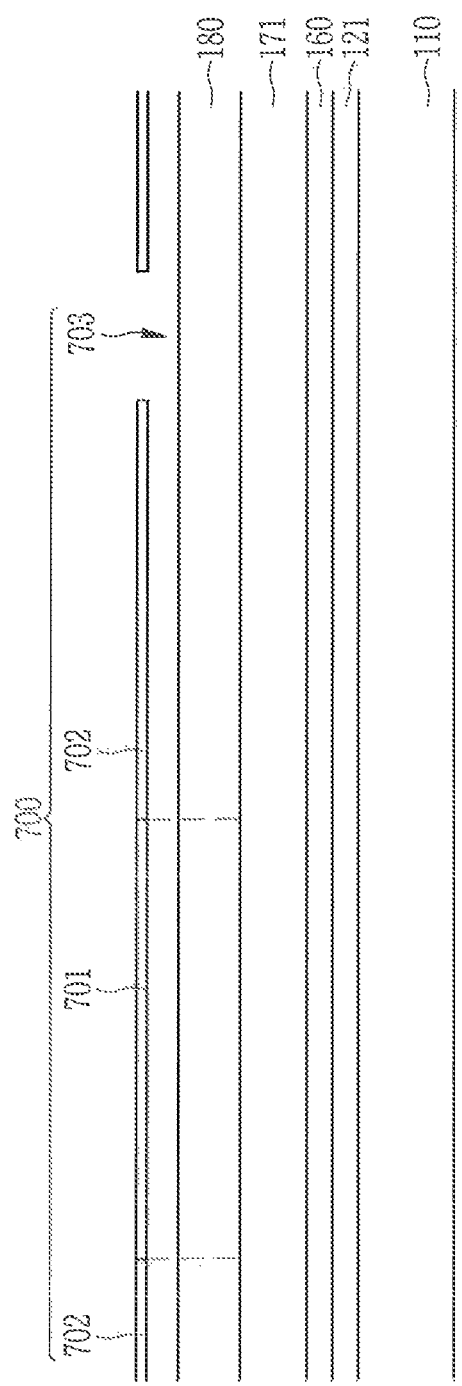

Next, referring to FIG. 7, a half-tone mask 700 is disposed on the insulating layer 180. In this case, the half-tone mask 700 includes an opening 703 corresponding to the contact hole 185 of the later insulating layer 180, a transparent region 701, and a transflective region 702. The transparent region 701 corresponds to the second part 182 of the insulating layer 180, and the transflective region 702 corresponds to the first part 181 of the insulating layer 180.

Figure 8:
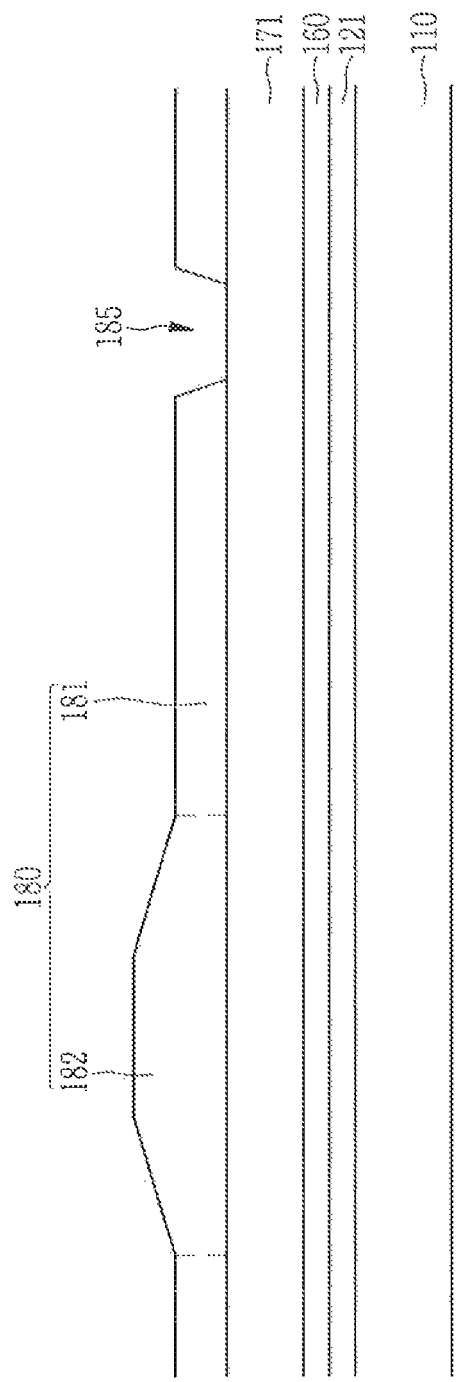

Referring to FIG. 8, the insulating layer 180 is etched by using the half-tone mask 700. As a result, in the insulating layer, the first part 181 having the first thickness, the second part 182 having the second thickness, and the contact hole 185 overlapping the thin film transistor are formed. The second thickness is larger than the first thickness, and the difference thereof may be within the range of 20% to 40% (e.g. the second thickness is within the range of 20% to 40% larger than the first thickness). The second part 182 and the first part 181 are each connected to the inclined surface, and the angle of the inclined surface may be within a range of 15 degrees to 25 degrees with respect to the plane of the substrate 110. The description for the first part 181 and the second part 182 of the insulating layer 180 is the same as provided above.

Figure 9:
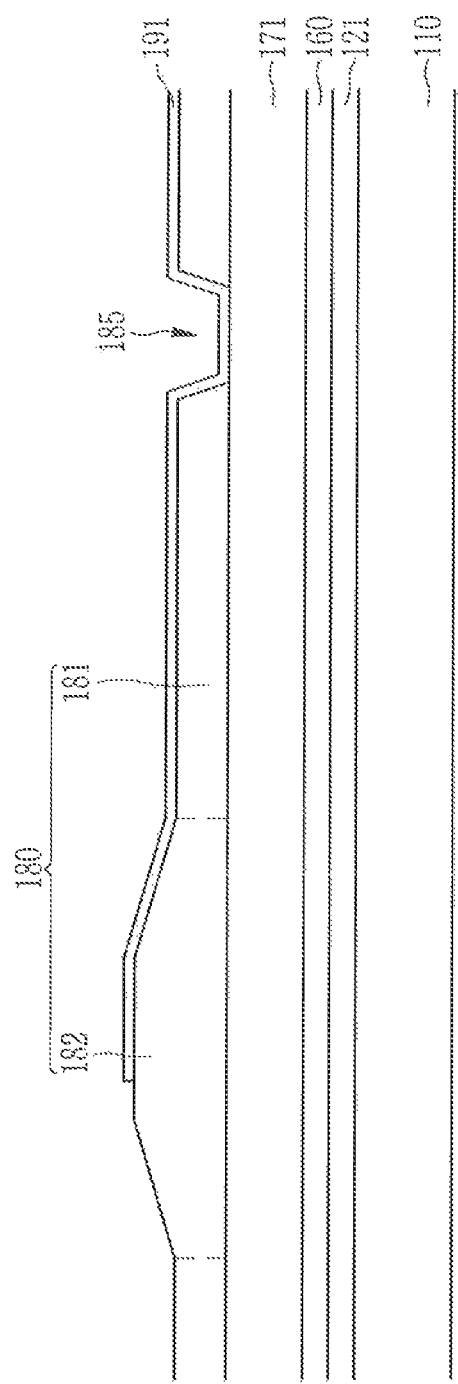

Referring to FIG. 9, the first electrode 191 is formed on the insulating layer 180. The first electrode 191 may be the pixel electrode. The first electrode 191 overlaps both of the first part 181 and the second part 182 of the insulating layer 180, and the first electrode 191 is connected to the thin film transistor through the contact hole 185.

Figure 10:
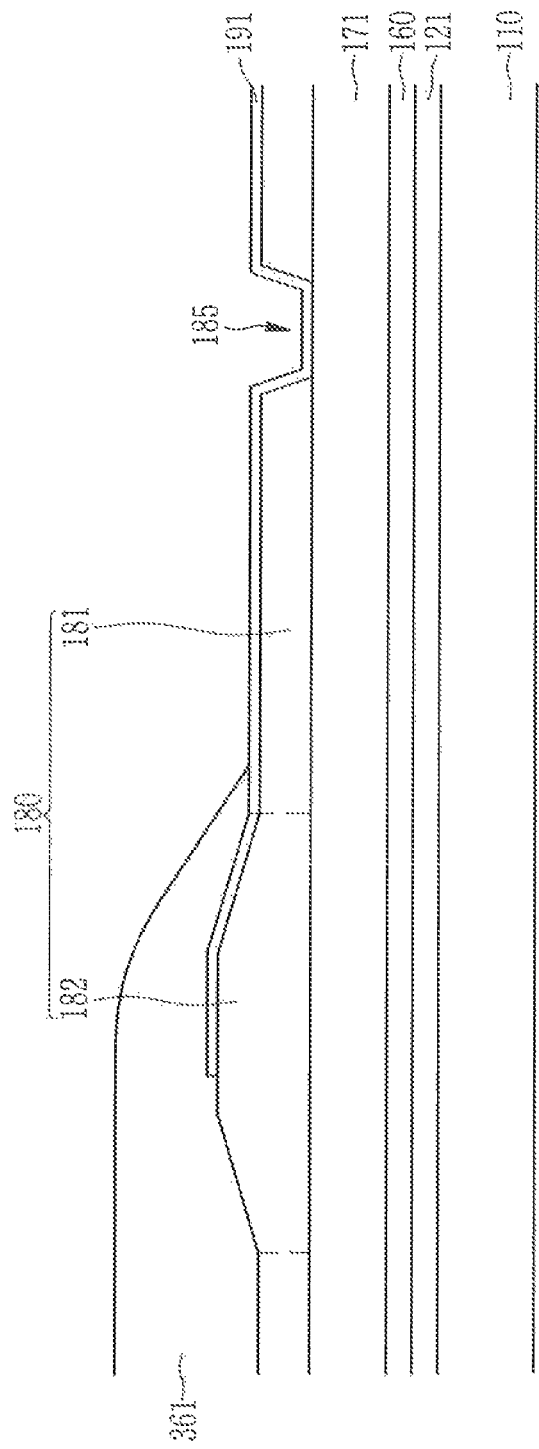

Referring to FIG. 10, the partition wall 361 is formed on the first electrode 191 and the insulating layer 180. The partition wall 361 may overlap the second part 182 of the insulating layer 180. In this case, the thickness of the partition wall 361 overlapping the second part 182 of the insulating layer 180 may be within the range of 1.0 μm to 1.2 μm. Also, the thickness of the partition wall 361 overlapping the first part 181 of the insulating layer 180 may be within the range of 1.4 μm to 2.0 μm. The partition wall 361 has the inclined surface on the edge, and the angle thereof may be within the range of 15 degrees to 25 degrees with respect to the plane of the substrate 110.

Figure 11:
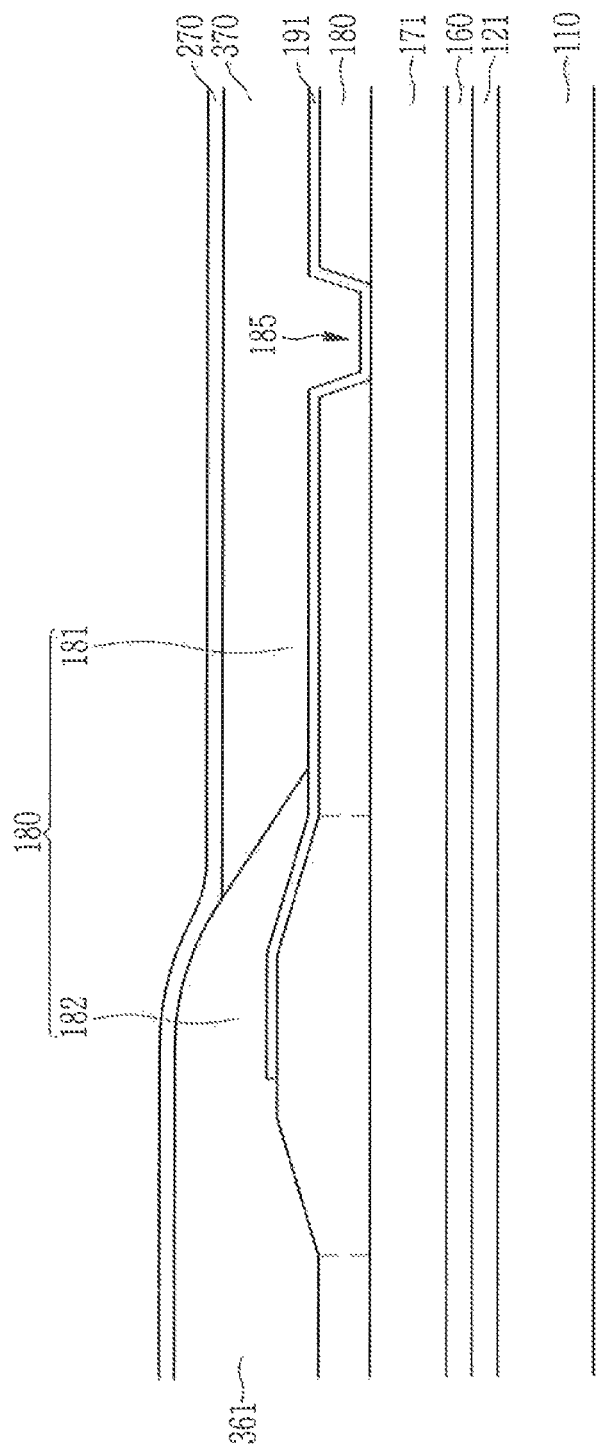

Referring to FIG. 11, the emission layer 370 is formed between the partition walls 361. Next, the second electrode 270 is formed on the partition wall 361 and the emission layer 370. The second electrode 270 may be the common electrode.

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. A light emitting device comprising:
    a substrate;
    a thin film transistor disposed on the substrate;
    a first electrode connected to the thin film transistor;
    a second electrode at least partially overlapping the first electrode;
    a first partition wall disposed between the first electrode and the second electrode; and
    an insulating layer disposed between the thin film transistor and the first electrode, wherein, in a cross-sectional view, a thickest part of the insulating layer is entirely overlapped by the first partition wall in a vertical direction that is perpendicular to a horizontal plane of the substrate.

2. The light emitting device of claim 1, wherein the insulating layer includes a first part having a first thickness and a second part having a second thickness that is different from the first thickness, and the second part of the insulating layer at least partially overlaps the first partition wall in the vertical direction, in the cross-sectional view.

3. The light emitting device of claim 2 wherein the second thickness is larger than the first thickness.

4. The light emitting device of claim 2, further comprising:
an emission layer disposed between the first electrode and the second electrode,
wherein the emission layer is disposed between the first partition wall and a next partition wall, and the emission layer at least partially overlaps the first part of the insulating layer.

5. The light emitting device of claim 2, wherein the first electrode at least partially overlaps both of the first part and the second part of the insulating layer.

6. The light emitting device of claim 2, wherein the thickness of the first partition wall overlapping the second part of the insulating layer is within a range of 1.0 μm to 1.2 μm.

7. The light emitting device of claim 2, wherein the thickness of the first partition wall overlapping the first part of the insulating layer is within a range of 1.4 μm to 2.0 μm.

8. The light emitting device of claim 2, wherein the second part of the insulating layer is 20% to 40% thicker than the first part of the insulating layer.

9. The light emitting device of claim 2, wherein the first part of the insulating layer and the second part of the insulating layer are connected with an inclined surface, and an angle of the inclined surface is within a range of 15 degrees to 25 degrees with respect to the horizontal plane of the substrate.

10. The light emitting device of claim 4, wherein the first partition wall has an inclined surface at a part thereof that is in contact with the emission layer, and the angle of the inclined surface is 15 within a range of degrees to 25 degrees with respect to the horizontal plane of the substrate.

11. A light emitting device, comprising:
a substrate;
an insulating layer disposed on the substrate;
a first electrode disposed on the insulating layer;
a partition wall disposed on the first electrode;
an emission layer disposed on the first electrode next to the partition wall; and
a second electrode disposed on the partition wall and the emission layer,
wherein, in a cross-sectional view, the first electrode terminates under the partition wall, with respect to a vertical direction that is perpendicular to a horizontal plane defined by the substrate, and
wherein, in the cross-sectional view, the partition wall is thinner in an area overlapping the terminating end of the first electrode than in an area that is not overlapped by the first electrode, with respect to the vertical direction.

* * * * *